(12) United States Patent
Matsuyuki et al.

(10) Patent No.: US 10,211,663 B2
(45) Date of Patent: Feb. 19, 2019

(54) 3D SHAPED INDUCTIVE CHARGING COIL AND METHOD OF MAKING THE SAME

(71) Applicant: APPLE INC., Cupertino, CA (US)

(72) Inventors: Naoto Matsuyuki, Nagoyo (JP); Christopher S. Graham, San Francisco, CA (US); Makiko K. Brzezinski, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 85 days.

(21) Appl. No.: 15/082,935

(22) Filed: Mar. 28, 2016

(65) Prior Publication Data

US 2017/0054318 A1    Feb. 23, 2017

Related U.S. Application Data

(60) Provisional application No. 62/208,451, filed on Aug. 21, 2015.

(51) Int. Cl.
*H02J 7/00* (2006.01)
*H02J 7/02* (2016.01)
(Continued)

(52) U.S. Cl.
CPC ............ *H02J 7/025* (2013.01); *H01F 27/327* (2013.01); *H01F 38/14* (2013.01); *H01F 41/127* (2013.01);
(Continued)

(58) Field of Classification Search
CPC . H02J 7/025; H02J 5/005; H02J 50/10; H01F 38/14; H01F 41/071; H01F 41/127;
(Continued)

(56) References Cited

U.S. PATENT DOCUMENTS 3,731,005 A * 5/1973 Shearman ............ G11B 5/1272
336/200
5,363,080 A * 11/1994 Breen ................. H01F 17/0006
336/192
(Continued)

FOREIGN PATENT DOCUMENTS

CN        103366931        10/2013
EP         2645385         10/2013
(Continued)

OTHER PUBLICATIONS

European Patent Application No. EP16178031.7, "Extended European Search Report", dated Jan. 19, 2017, 4 pages.
(Continued)

*Primary Examiner* — Helen Rossoshek
(74) *Attorney, Agent, or Firm* — Kilpatrick Townsend & Stockton LLP

(57) ABSTRACT

A three-dimensional inductive charging coil assembly and a method of making the same. The method can include patterning a first conductive layer affixed to a first surface of an insulating layer to form a coil configured to transmit or receive power, patterning a second conductive layer affixed to a second surface of the insulating layer opposite the first surface to form a conductive trace element, and electrically coupling the coil and the conductive trace element. The coil, insulating layer, and conductive trace element can be molded (e.g., simultaneously) into a three dimensional shape. In some embodiment, the molding can include a thermoforming process such as compression molding, vacuum forming, or the like.

9 Claims, 10 Drawing Sheets

(51) Int. Cl.
*H01F 27/32* (2006.01)
*H01F 38/14* (2006.01)
*H01F 41/12* (2006.01)
*H02J 5/00* (2016.01)
*H01L 23/522* (2006.01)
*H02J 50/10* (2016.01)
*H01F 27/28* (2006.01)

(52) U.S. Cl.
CPC ...... *H01L 23/5226* (2013.01); *H01L 23/5227* (2013.01); *H02J 5/005* (2013.01); *H01F 27/2871* (2013.01); *H01F 2027/2809* (2013.01); *H02J 50/10* (2016.02)

(58) Field of Classification Search
CPC ........... H01F 27/327; H01F 2027/2809; H01F 27/2871; H01L 23/5226; H01L 23/5227
See application file for complete search history.

(56) References Cited

U.S. PATENT DOCUMENTS

| | | | |
|---|---|---|---|
| 5,437,091 A | 8/1995 | Norman | |
| 5,548,265 A * | 8/1996 | Saito | H01F 17/0006 336/200 |
| 7,125,788 B2 * | 10/2006 | Domon | H01L 23/5227 438/613 |
| 7,902,826 B2 | 3/2011 | Yin et al. | |
| 8,646,695 B2 | 2/2014 | Worral et al. | |
| 8,855,786 B2 * | 10/2014 | Derbas | A61N 1/0553 607/68 |
| 8,857,983 B2 * | 10/2014 | Pugh | H01Q 1/22 351/159.39 |
| 9,460,996 B1 * | 10/2016 | Zang | H01L 23/5227 |
| 9,479,007 B1 * | 10/2016 | Jol | H02J 7/025 |
| 2006/0113991 A1 * | 6/2006 | LaClair | G01B 7/14 324/207.26 |
| 2011/0050164 A1 * | 3/2011 | Partovi | H01F 5/003 320/108 |
| 2012/0057322 A1 * | 3/2012 | Waffenschmidt | H01F 27/365 361/816 |
| 2013/0335186 A1 * | 12/2013 | Chang | H01F 5/003 336/200 |
| 2014/0176282 A1 | 6/2014 | Jung et al. | |
| 2014/0306361 A1 * | 10/2014 | Pugh | H01Q 1/22 264/1.7 |
| 2015/0002213 A1 * | 1/2015 | Zhang | H01L 23/5252 327/525 |
| 2015/0303699 A1 * | 10/2015 | Wagman | H02J 5/005 307/104 |
| 2015/0348697 A1 * | 12/2015 | Graham | H01F 27/2823 336/189 |
| 2016/0156215 A1 * | 6/2016 | Bae | H01Q 7/00 320/108 |
| 2016/0172310 A1 * | 6/2016 | Zhai | H01L 23/552 257/659 |
| 2016/0372961 A1 * | 12/2016 | Ritter | H02J 50/12 |
| 2017/0338029 A1 * | 11/2017 | Perez | H01F 38/14 |

FOREIGN PATENT DOCUMENTS

| | | |
|---|---|---|
| JP | 2011072115 | 4/2011 |
| JP | 2011109546 | 6/2011 |
| JP | 2011216621 | 10/2011 |
| JP | 5523069 | 6/2014 |

OTHER PUBLICATIONS

Chinese Patent Application No. 201610694505.1, "Office Action", dated Jun. 5, 2018, 9 pages.

* cited by examiner

3D SHAPED INDUCTIVE CHARGING COIL AND METHOD OF MAKING THE SAME

CROSS-REFERENCES TO RELATED APPLICATION

This application claims priority to U.S. Provisional Patent Application No. 62/208,451 filed Aug. 21, 2015, which is incorporated by reference herein in its entirety for all purposes.

FIELD

The present invention relates generally to wireless charging. More particularly, some embodiments of the invention relate to inductive coil assemblies, and methods of making inductive coil assemblies, configured to wirelessly transmit and/or receive power and characterized by a three-dimensional shape.

BACKGROUND

Wireless charging uses an electromagnetic field to transfer energy from a charging device (such as a charging station) to an inductively coupled electronic device (such as a wearable device, smart phone, or the like). Typically, an inductive coil within the charging device (a "transmitter") generates a time-varying electromagnetic field from, for example, an alternating current (AC) flowing through the coil. This field generates a corresponding time-varying current within a second inductive coil in the electronic device (a "receiver") by way of electromagnetic induction, and the electronic device can use this generated current to charge its battery. The transmitter and receiver inductive coils in proximity to each other effectively form an electrical transformer. Generally, the inductive coils must be in close proximity for power to be transferred. As the distance between the coils increases, power transfer becomes less efficient.

The proximity requirement can be especially problematic for electronic devices and their charging stations having three-dimensional (e.g., curved) charging surfaces. Inductive charging coils generally have a planar geometry. Thus, when a conventional coil is disposed along a non-planar charging surface of an electronic device or charging station, portions of the coil may be positioned some distance from the surface. This increases the distance between portions of the transmitter and receiver coils, thereby reducing wireless charging efficiency.

In one existing solution, wound coils have been designed where a wire is physically wound about an object having the desired three-dimensional geometry. Such processes, however, are time consuming and are associated with low precision of coil geometry and wire spacing, thereby resulting in undesirable losses in charging efficiency.

SUMMARY

Some embodiments of the invention pertain to methods of making three-dimensional inductive coil assemblies used for wireless charging. Other embodiments pertain to three-dimensional inductive coil assemblies used for wireless charging, and some other embodiments pertain to inductive chargers comprising such three-dimensional inductive coil assemblies. The three-dimensional inductive coil assemblies in accordance with embodiments of the present invention can be used in wearable electronic devices with curved charging surfaces (such as the Apple WATCH), but embodiments of the invention are not limited to such applications.

In some embodiments, a method of making a three-dimensional inductive coil assembly for wireless charging can include patterning (e.g., by etching) a first conductive layer affixed to a first surface of an insulating layer. The patterning can form a coil configured to wirelessly transmit or receive power. A second conductive layer affixed to a second surface of the insulating layer opposite the first surface can be patterned (e.g., by etching) to form a conductive trace element. In some embodiments, the first and second conductive layers can comprise a metal, and the insulating layer can comprise a polymer. The coil and the conductive trace element can be electrically coupled (e.g., by forming a via through the insulating layer).

The multi-layered structure comprising the coil, the insulating layer, and the trace element, can be molded into a three-dimensional shape. In some embodiments, the molding can include a compression molding process. In some other embodiments, the molding can include a vacuum forming process. In some embodiments, the method can further include laminating the coil and an exposed region of the first surface of the insulating layer prior to molding. In further embodiments, the method can include depositing a ferromagnetic layer (e.g., ferrite) onto the conductive trace element and an exposed region of the second surface of the insulating layer prior to molding. In some embodiments, the multi-layered structure comprising the coil, the insulating layer, and the trace element can be molded simultaneously.

In some embodiments, a three-dimensional inductive coil assembly is provided that can be used for wireless charging, either as a transmitter or a receiver. The three-dimensional coil assembly can include an insulating layer comprising a first surface and a second surface opposite the first surface, a first conductive layer affixed to the first surface of the insulating layer and patterned to form a coil configured to transmit or receive power, and a second conductive layer affixed to the second surface of the insulating layer and patterned to form a conductive trace element. In some embodiments, the first and second conducive layers can comprise a metal, and the insulating layer can comprise a polymer. The coil and the conductive trace element can be electrically coupled (e.g., by way of a via formed through the insulating layer). The first conductive layer, the insulating layer, and the second conductive layer can be characterized by a three-dimensional shape.

In some embodiments, the coil assembly can further include a laminate layer disposed on the first conductive layer and characterized by the three-dimensional shape. In further embodiments, the coil assembly can include a ferrite layer disposed on the second conductive layer and characterized by the three-dimensional shape.

In some embodiments, an inductive charger is provided that can include a charging surface and an inductive coil assembly adjacent to the charging surface. The coil assembly can include a polymer layer comprising a first surface and a second surface opposite the first surface, a first metal layer adhesively coupled to the first surface of the polymer layer and patterned to form a coil configured to transmit or receive power, and a second metal layer adhesively coupled to the second surface of the insulating layer and patterned to form a conductive trace element. The coil assembly can further include a via formed through the polymer layer that electrically couples the coil and the conductive trace element. In some embodiments, the charging surface can be nonplanar, and the inductive coil assembly can be characterized by a three-dimensional shape such that it conforms to a contour of the nonplanar charging surface. In some further embodiments, the coil assembly can further include a laminate layer disposed on the first metal layer.

The following detailed description together with the accompanying drawings in which the same reference numerals are sometimes used in multiple figures to designate similar or identical structures structural elements, provide a better understanding of the nature and advantages of the present invention.

DETAILED DESCRIPTION

Some embodiments of the invention pertain to methods of making a three-dimensional inductive coil assembly configured to transmit or receive power in an electronic device or charging station. As described in further detail below, the methods can include patterning and molding a multi-layered coil structure to form a coil assembly having the desired three-dimensional shape. The described methods can provide a number of advantages over existing solutions, including enhanced coil shape control, improved precision of coil dimensions, the ability to form thinner coils occupying less space, scalability, and more efficient and low-cost manufacturing processes. Moreover, the three-dimensional shape of the formed coil assemblies can precisely conform to the contours of the charging surface of an electronic device or charging station. Such a configuration can reduce the distance between transmitter and receiver coils when an electronic device is "docked" in the charging station, thereby improving power transfer efficiency.

Figure 1:
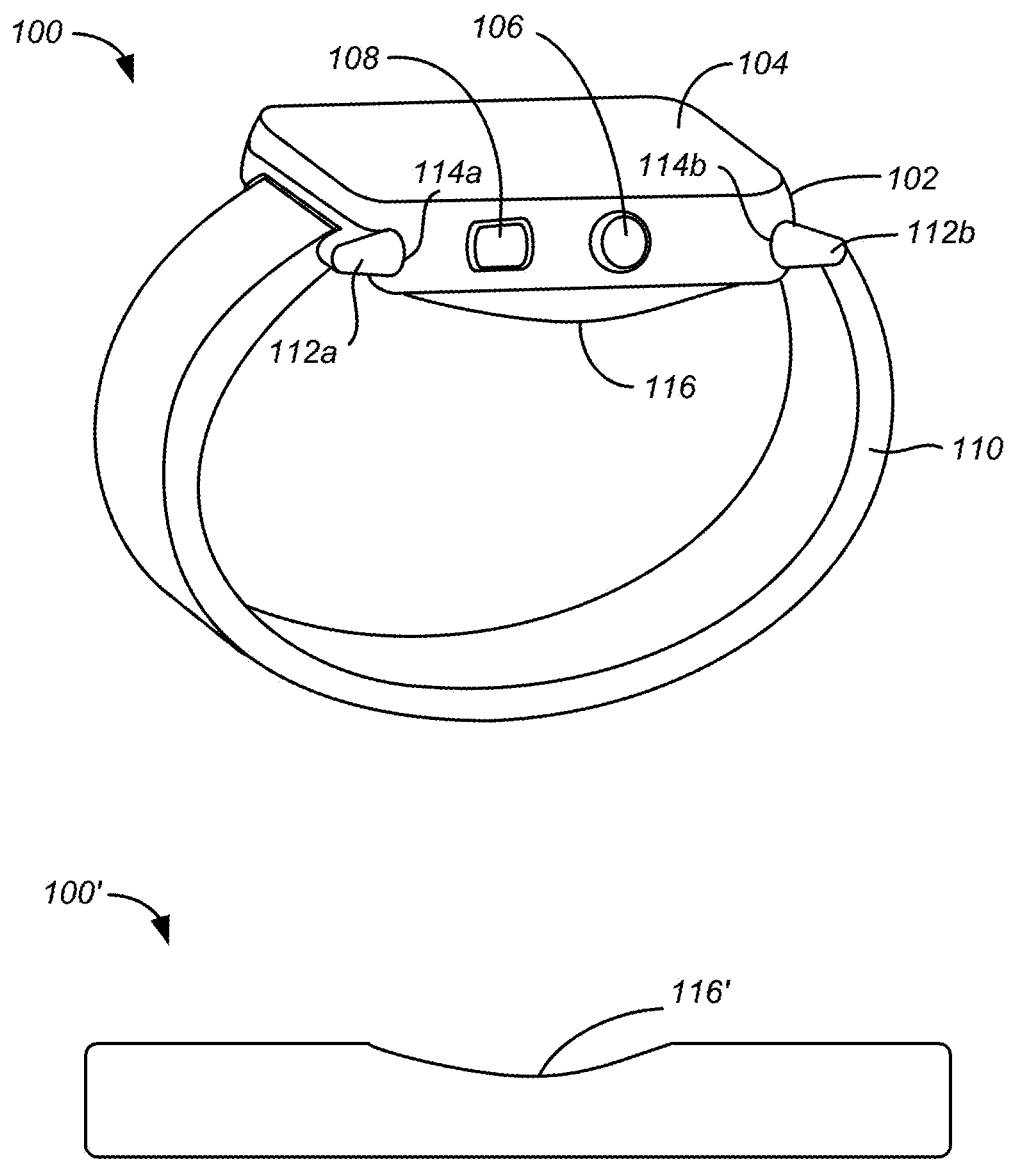
FIG. 1 is a simplified view of an example electronic device (i.e. a watch) and corresponding charging station which can each incorporate a three-dimensional inductive coil assembly in accordance with some embodiments of the invention.

Embodiments of the invention may operate with one or more inductive charging components such as electronic devices and chargers. An example is shown in FIG. 1. As shown, a wearable electronic device 100 (i.e. a watch) includes a casing 102 that houses a display 104 and various input devices including a dial 106 and a button 108.

Device 100 may be worn on a user's wrist and secured thereto by a band 110. Band 110 includes lugs 112a, 112b at opposing ends of band 110 that fit within respective recesses or apertures 114a, 114b of casing 102 and allow band 110 to be removably attached to casing 102. Lugs 112a, 112b may be part of band 110 or may be separable (and/or separate) from the band. Generally, lugs 112a, 112b may lock into recesses 114a, 114b and thereby maintain connection between band 110 and casing 102. Casing 102 can include electronic circuitry (not shown), including a processor, communication circuitry, and sensors that enable device 100 to perform a variety of functions.

A battery (not shown) internal to casing 102 powers device 100. The battery can be recharged by an external power source, and device 100 can include circuitry configured to operate as a receiver in a wireless power transfer system. For example, the circuitry can include a receiver coil configured for inductive charging, such that a current is generated within the coil in response to an externally applied time-varying magnetic field. The receiver coil can be disposed within casing 102 and, in particular, above a curved charging surface 116 shown in FIG. 1.

FIG. 1 also shows a "charger" or charging station 100'. Charger 100' includes a curved charging surface 116' that is designed to conform to surface 116 of device 100. Charger 100' can be connected to an external power supply through a cable (not shown), and can also include a power-transmitting component such as an inductive transmitter coil to transmit power wirelessly to device 100. For example, when device 100 is docked in charger 100' with surface 116 resting on surface 116', a transmitter coil disposed below surface 116' can generate a time-varying magnetic field (e.g., by way of AC flowing through the transmitter coil). The generated field can then induce a corresponding time-varying current in the receiver coil disposed above surface 116 of device 100. Device 100 can utilize the generated current (e.g., by rectification into DC) to power its battery. Device 100 and charger 100' are examples of inductive charging components.

Figure 2:
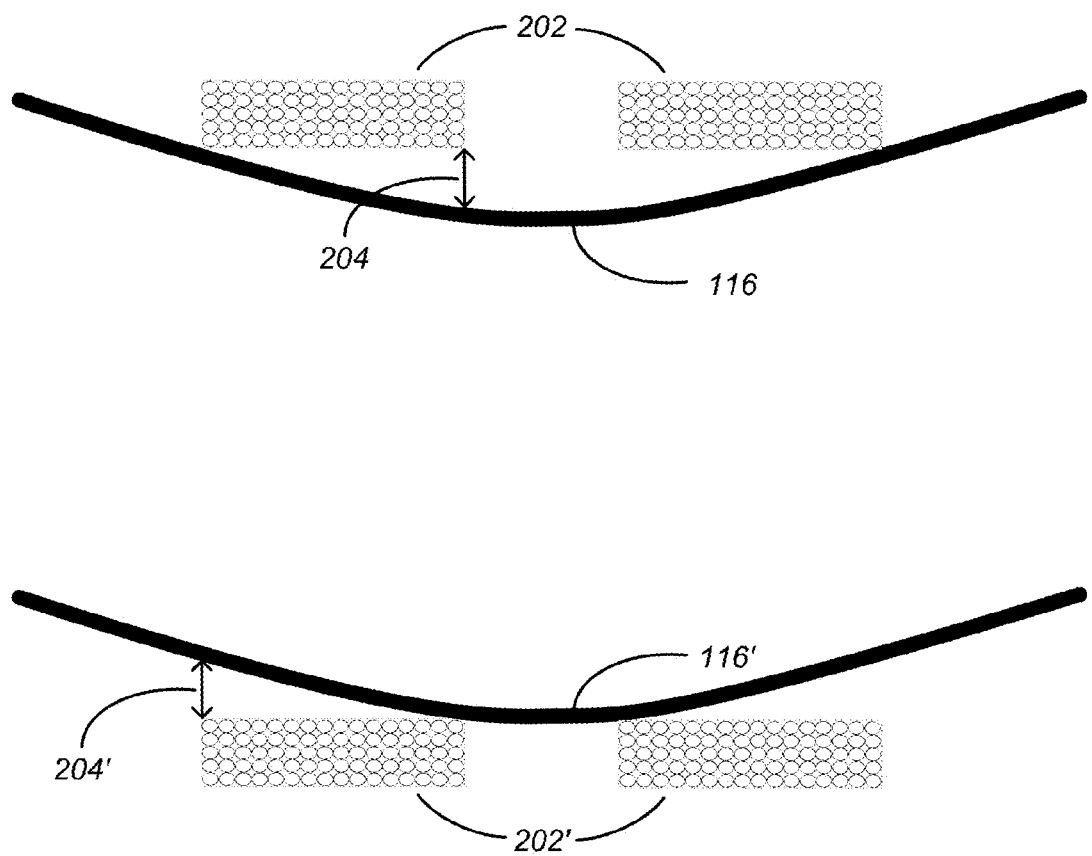
FIG. 2 is a simplified cross-sectional view of a planar inductive receiver coil disposed above a curved charging surface of an electronic device, and a simplified cross-sectional view of a corresponding planar inductive transmitter coil disposed under a curved charging surface of a charging station.

FIG. 2 is an expanded, simplified, cross-sectional view of surface 116 of device 100 showing an inductive charger receiver coil 202 disposed above surface 116. As shown, receiver coil 202 is a conventional flat coil. As a result of the planar geometry, coil 202 is disposed close to surface 116 but does not precisely conform to it, thereby creating a gap 204.

Also shown in FIG. 2 is an expanded, simplified, cross-sectional view of surface 116' of charger 100'. Similar to receiver coil 202, charger 100' includes a conventional flat transmitter coil 202' disposed below surface 116'. Transmitter coil 202' is disposed close to surface 116' but does not conform to surface 116' due to its planar geometry, thereby creating a gap 204'. As a result of gaps 204, 204', there is an undesirable spacing between coils 202, 202' when device 100 is docked in charger 100', as this spacing can reduce power transfer efficiency from charger 100' to device 100.

In embodiments of the present invention, methods are provided for making three-dimensional inductive coil assemblies that can better conform to the charging surfaces of electronic devices and charging stations, thereby reducing or eliminating gaps (e.g., gaps 204, 204') and improving charging efficiency. In some embodiments, methods can include patterning and molding a multi-layered structure to form a coil assembly having the desired geometry.

Figure 3:
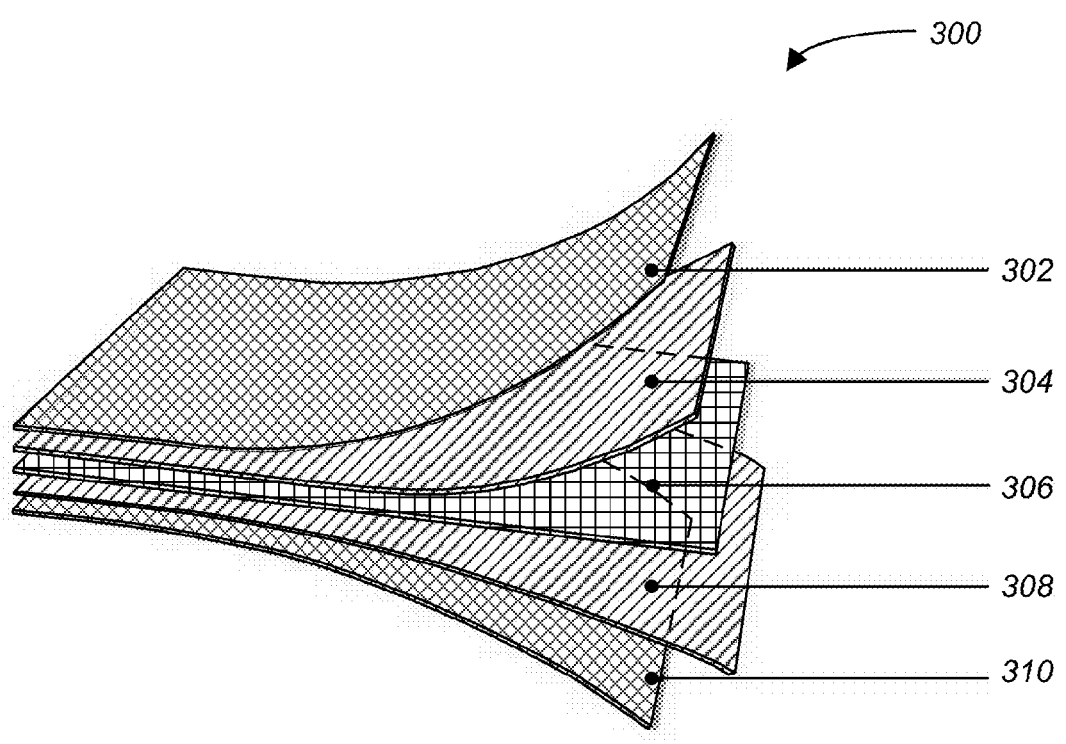
FIG. 3 shows a multi-layered structure usable to form a three-dimensional inductive coil assembly according to some embodiments of the invention.

FIG. 3 shows a multi-layered structure 300 usable to form a three-dimensional inductive coil assembly according to some embodiments of the invention. In the example shown in FIG. 3, structure 300 comprises a plurality of layers including a first conductive layer 302, an insulating layer 306, and a second conductive layer 310.

First conductive layer 302 and second conductive layer 310 can comprise any suitable electrically conductive material including, but not limited to, metals (e.g., copper, gold, silver, etc.), alloys, semiconductors, conductive ceramics, conductive polymers, and the like. Insulating layer 306 can comprise any suitable electrically insulating material compatible with molding processes such as the thermoforming processes described herein. For example, in some embodiments, insulating layer can comprise a polymer such as polyimide, PET, and other thermoformable materials.

As shown in FIG. 3, first conductive layer 302 can be affixed to a first surface of insulating layer 306 by a first adhesive layer 304 which can comprise, for example, epoxy, acrylic, or the like. Similarly, second conductive layer 310 can be affixed to a second surface of insulating layer 306 by a second adhesive layer 308 which can also comprise, for example, epoxy, polyimide, or acrylic.

Starting with multi-layered structure 300, a number of processes can be performed in accordance with various embodiments of the present invention to form an inductive coil assembly having a three-dimensional shape. For example, as described in further detail below with regard to the method of FIG. 4, first conductive layer 302 can be patterned (e.g., by etching) to form a coil configured to transmit or receive power. Second conductive layer 310 can also be patterned to form a conductive trace element. The coil and conductive trace element can be electrically coupled by, for example, forming a via through the insulating layer. In some embodiments, the resulting structure comprising the coil, insulator layer, and trace element can then be molded into a desired three-dimensional shape using a thermoforming process such as compression molding, vacuum forming, or the like.

It should be noted that the particular configuration of structure 300 shown in FIG. 3 is not intended to be limiting. For example, although structure 300 is depicted as including one insulating layer disposed between two conductive layers, any suitable number of conductive and insulating layers can be utilized in accordance with various embodiments of the invention.

Figure 4:
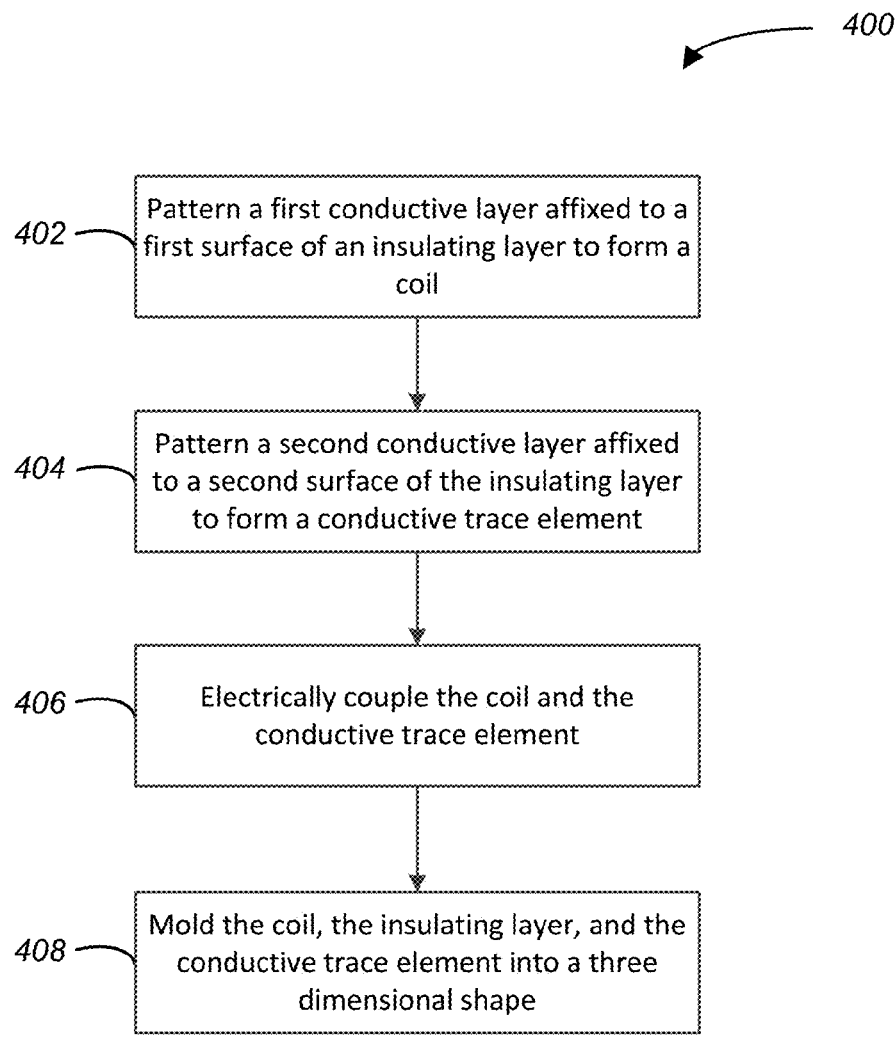
FIG. 4 is a flowchart of a method of making a three-dimensional inductive coil assembly for wireless charging according to some embodiments of the invention.

FIG. 4 is a flowchart of a method 400 of making a three-dimensional inductive coil assembly according to some embodiments of the invention. In some embodiments, method 400 can incorporate a multi-layered structure such as structure 300 described above and shown in FIG. 3. For simplicity of discussion, method 400 is described below with reference to the various layers of structure 300.

At block 402, a first conductive layer (i.e. layer 302) affixed to a first surface of an insulating layer (i.e. layer 306) is patterned to form a coil configured to transmit or receive power. In some embodiments, the coil can be patterned from first conductive layer 302 using an etching process where regions of first conductive layer 302 are removed by a chemical etchant with the portions of first conductive layer 302 left behind forming the coil. For example, in some embodiments, a mask that is resistant to the etchant and includes the desired coil design (e.g., a spiral) can be affixed to the surface of first conductive layer 302 exposed to the etchant, the mask being removed at the end of the patterning process.

In some embodiments, photolithography techniques can be used to generate the mask having the desired coil design. In such processes, a layer of photoresist can be applied to first conductive layer 302 and exposed to light (e.g., UV) in the desired geometric pattern. Upon application of a developer solution that dissolves the regions of the photoresist exposed to the light (or that dissolves the un-exposed regions), the remaining photoresist can act as the mask that forms the coil design in first conductive layer 302 after etching.

Any suitable etchant can be used in embodiments of the invention so long as the selected etchant dissolves the exposed regions of first conductive layer 302 but does not dissolve (or dissolves at a slower rate) the mask material. Suitable etchants can include, but are not limited to, hydrofluoric acid, phosphoric acid, hydrochloric acid, nitric acid, sodium hydroxide, SC-1 solution, organic solvents, plasma etchants, and the like. Coils having very intricate patterns can be precisely formed according to embodiments of the present invention.

In some other embodiments, first conductive layer 302 can be printed or otherwise deposited onto insulating layer 306 in the desired coil pattern using known printing or deposition techniques. Depending on the feature size required for the coil, solid ink printers can be used to print the coil and/or to print the mask prior to etching.

At block 404, a second conductive layer (i.e. layer 310) affixed to a second surface of insulating layer 306 opposite the first surface is patterned to form a conductive trace element. As with the coil patterned at block 404, the conductive trace element can be patterned from second conductive layer 310 using an etching process where regions of second conductive layer 310 are removed by a chemical etchant with the portions of second conductive layer 310 left behind forming the conductive trace element. For example, in some embodiments, a mask that is resistant to the etchant and includes the desired trace element design (e.g., a flat wire) can be affixed to the surface of second conductive layer 310 exposed to the etchant, the mask being removed at the end of the patterning process.

In some embodiments, photolithography techniques can be used to generate the mask having the desired trace element design. In such processes, a layer of photoresist can be applied to second conductive layer 310 and exposed to light (e.g., UV) in the desired geometric pattern. Upon application of a developer solution that dissolves the regions of the photoresist exposed to the light (or dissolves the un-exposed regions), the remaining photoresist can act as the mask that leaves behind the conductive trace element in second conductive layer 310 after etching.

Any suitable etchant can be used in embodiments of the invention so long as the selected etchant dissolves the exposed regions of second conductive layer 310 but does not dissolve (or dissolves at a slower rate) the mask material. Suitable etchants can include, but are not limited to, hydrofluoric acid, phosphoric acid, hydrochloric acid, nitric acid, sodium hydroxide, SC-1 solution, organic solvents, plasma etchants, and the like. In some other embodiments, second conductive layer 310 can be printed or otherwise deposited onto insulating layer 306 in the desired pattern using known printing or deposition techniques.

At block 406, the coil formed from patterning first conductive layer 302, and the conductive trace element formed from patterning second conductive layer 310 can be electrically coupled. In some embodiments, this coupling can be achieved by way of a via that extends through insulating layer 306, and through adhesive layers 304, 308. For example, a hole can be punched through the patterned multi-layered structure and then filled with an electrically conductive material (e.g., a metal) that contacts both the coil and the trace element, thereby forming the via electrically coupling the coil and trace element. In some embodiments, the conductive material in the via, first conductive layer 302, and second conductive layer 310 can be the same material (e.g., copper).

Additional processing can be performed on the multi-layered structure formed at blocks 402-406. In some embodiments, method 400 can further include laminating the coil and an exposed region of the first surface of insulating layer 306. In further embodiments, method 400 can further include depositing a ferromagnetic layer onto the conductive trace element and an exposed region of the second surface of insulating layer 306. In some other embodiments, the ferromagnetic layer can be deposited onto the coil and the exposed region of the first surface of insulating layer 306, and laminating can be performed on the conductive trace element and the exposed region of the second surface of insulating layer 306. The ferromagnetic material can comprise ferrite (i.e. a material comprising $Fe_2O_3$) in some embodiments. The laminate can comprise any suitable electrically insulating material including, for example, an epoxy resin, in some embodiments.

Figure 5A:
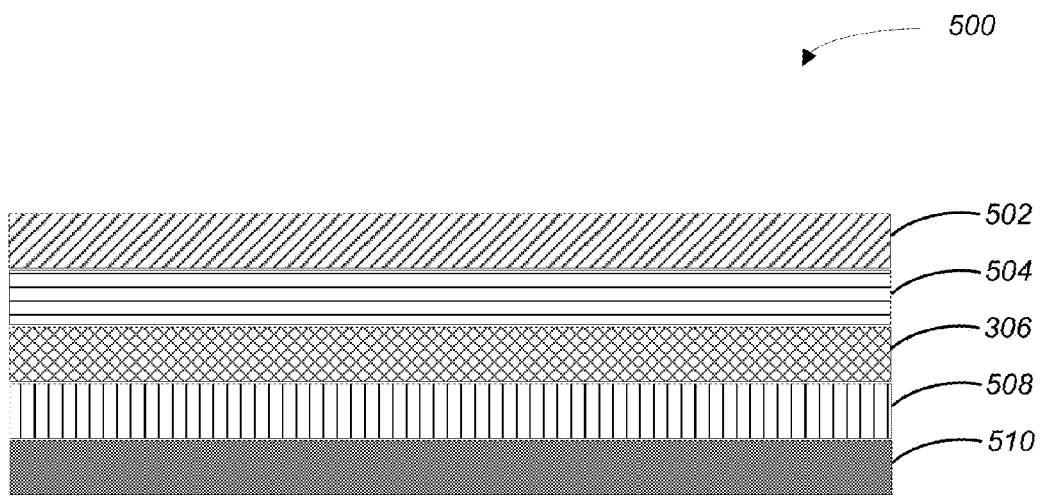
FIG. 5A is a simplified cross-sectional view of a multi-layered coil assembly prior to molding according to some embodiments of the invention.

FIG. 5A is a simplified cross-sectional view of a multi-layered coil assembly 500 prior to molding (i.e. prior to block 408 of method 400) according to some embodiments of the invention. As shown in FIG. 5A, assembly 500 can include laminate layer 502, patterned coil 504, insulating layer 306, conductive trace element 508, and ferromagnetic layer 510. In some embodiments, adhesive layers (e.g., layers 304, 308 in FIG. 3) may be present between patterned coil 504 and insulating layer 306 and between insulating layer 306 and conductive trace element 508. Laminate layer 502 can serve the function of electrically insulating the final coil assembly from nearby components or metallic surfaces of an electronic device or charging station in which the coil assembly is installed. Ferromagnetic layer 510 can serve the function of containing and concentrating magnetic fields within the coil assembly during wireless charging, thereby improving the efficiency of power transfer. In some embodiments, ferromagnetic layer 510 can comprise a composite of polymer and ferrite characterized by a ductility suitable for thermoforming processes. The polymer, such as an acrylic polymer in some embodiments, may act as a binder for small ferrite particles. Such a composite may be designed to not crack during subsequent thermoforming processes due to its ductility at high temperatures.

Figure 5B:
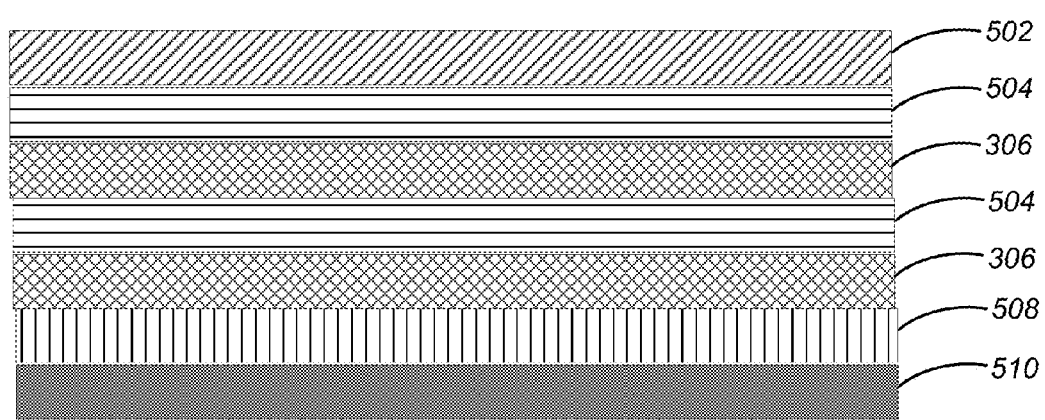
FIG. 5B is a simplified cross-sectional view of another multi-layered coil assembly prior to molding according to some embodiments of the invention.

FIG. 5B is a simplified cross sectional view of multi-layered coil assembly 550 prior to molding according to some embodiments of the invention. As shown in FIG. 5B, assembly 550 can include more than one patterned coil. Assembly 550 can include laminate layer 502, patterned coil 504, insulating layer 306, a second patterned coil 505, a second insulating layer 306, conductive trace element 508, and ferromagnetic layer 510. In some embodiments, patterned coil 505 can be patterned differently from patterned coil 504. In some embodiments, an insulating layer between second patterned coil 505 and conductive trace element 508 can be made of a different material from the insulating layer between first patterned coil 504 and second patterned coil 505. Although assembly 550 includes two patterned coil layers, other embodiments can include three or more patterned coil layers separated by insulating layers.

In some other embodiments, not shown in FIGS. 5A-5B, laminate layer 502 and ferromagnetic layer 510 can be added to assembly 500 after block 408 in FIG. 4. For example, when laminate layer 502 and/or ferromagnetic layer 510 are not ductile enough for thermoforming processes, one or both of these layers can be applied in one or more separate processes.

At block 408, assembly 500 can be subjected to a molding process to form a three-dimensional shape. In some embodiments, the assembly that is molded comprises patterned coil 504, insulating layer 306, and conductive trace element 508. In some embodiments, as shown in FIGS. 5A-5B, the assembly that is molded further comprises laminate layer 502 and ferromagnetic layer 510. In some embodiments, at block 408, the assembly can be molded into the three-dimensional shape by way of a thermoforming process where pressure and heat are applied simultaneously. Exemplary thermoforming processes are described in further detail below with reference to FIGS. 6A-7B.

Figure 6A:
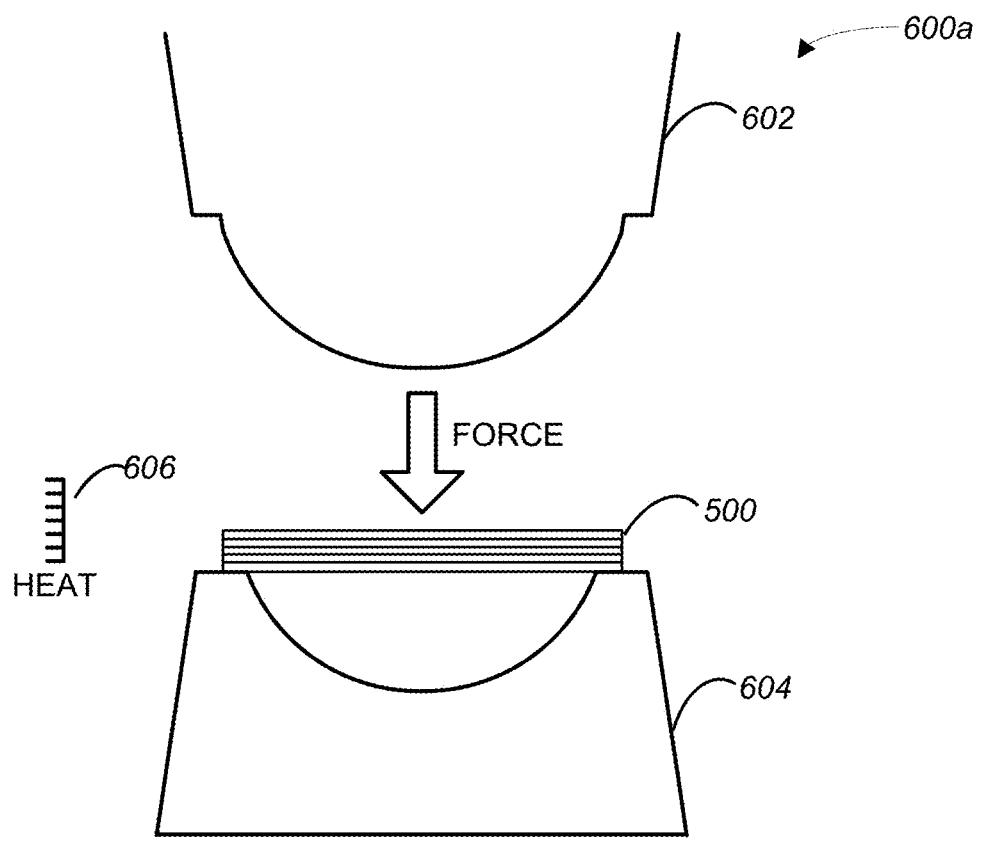
FIG. 6A and FIG. 6B are simplified diagrams illustrating a compression molding process according to some embodiments of the invention.
Figure 6B:
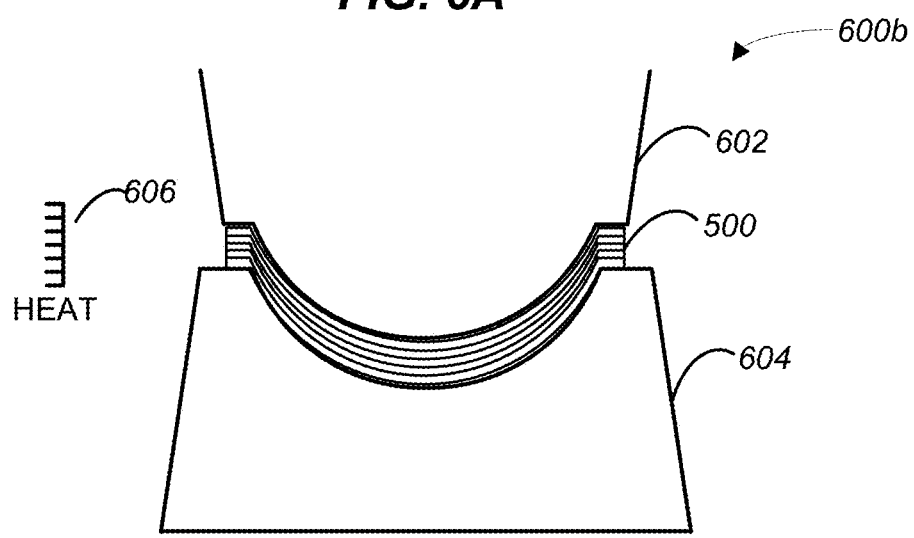

FIGS. 6A and 6B are simplified diagrams illustrating a compression molding process according to some embodiments of the invention. In FIGS. 6A-6B, the compression molding process is illustrated in two parts, 600a, 600b for simplicity of discussion. As shown in FIG. 6A, multi-layered coil assembly 500 from FIG. 5A is placed on a mold 604. Mold 604 can have a cavity having a shape that corresponds to the final three-dimensional target shape of coil assembly 500. In FIG. 6A, this target shape has a concave bowl-like geometry. In other embodiments, the cavity shape of mold 604 can correspond to any other suitable geometry designed to conform to the contours of a charging surface of an electronic device or charging station.

In some embodiments, the cavity shape of mold 604 can be slightly different than the final target shape of coil assembly 500 to account for elastic deformation. In such embodiments, the cavity shape of mold 604 can be calculated to account for "spring-back" effects after molding. By taking such factors into account, the final three-dimensional shape of coil assembly 500 can precisely conform to a charging surface of the intended electronic device or charging station.

As shown FIG. 6A, a plug member 602 can have a shape that corresponds to the shape of the cavity of mold 604. For example, in this non-limiting illustration, plug member 602 has a convex shape that corresponds to the concave shape of the cavity of mold 604. Appropriate force can be applied through the movement of plug member 602 towards the cavity of mold 604 (or vice versa), thereby contacting and deforming coil assembly 500 in the process. As force (i.e. pressure) is applied, a heating element 606 can provide the appropriate temperature to soften coil assembly 500 thereby improving the ductility of the constituent layers. For example, heating can be provided through infra-red (IR) heating, radio frequency (RF) heating, hot air heating, and the like. In some embodiments, the heat and pressure can be maintained until insulating layer 306 (e.g., polyimide) has cured. In some embodiments, a temperature of 100-250° C. can be used. The length of time during which heat and pressure are applied can vary depending on, for example, the shape and size of coil assembly 500.

FIG. 6B shows coil assembly 500 in mold 604 after heat and pressure have been applied. As seen in FIG. 6B, coil assembly 500 can take the shape of the space between mold 604 and plug member 602. In some embodiments, coil assembly 500, in this shape, can conform to a charging surface of an electronic device or charging station and can represent the final shape of the coil assembly. In some other embodiments, the shape of coil assembly 500 may change upon removing of the pressure and/or cooling, owing to a spring-back effect. In such embodiments, the shape of the coil assembly after spring-back may conform to the desired charging surface.

At the end of molding, and after cooling, the final multi-layered coil assembly having the three-dimensional shape may be rigid. According to some embodiments, a trimming or cutting of excess material can be performed prior to installing the coil assembly of the desired shape and dimensions in an electronic device or charging station.

Figure 7A:
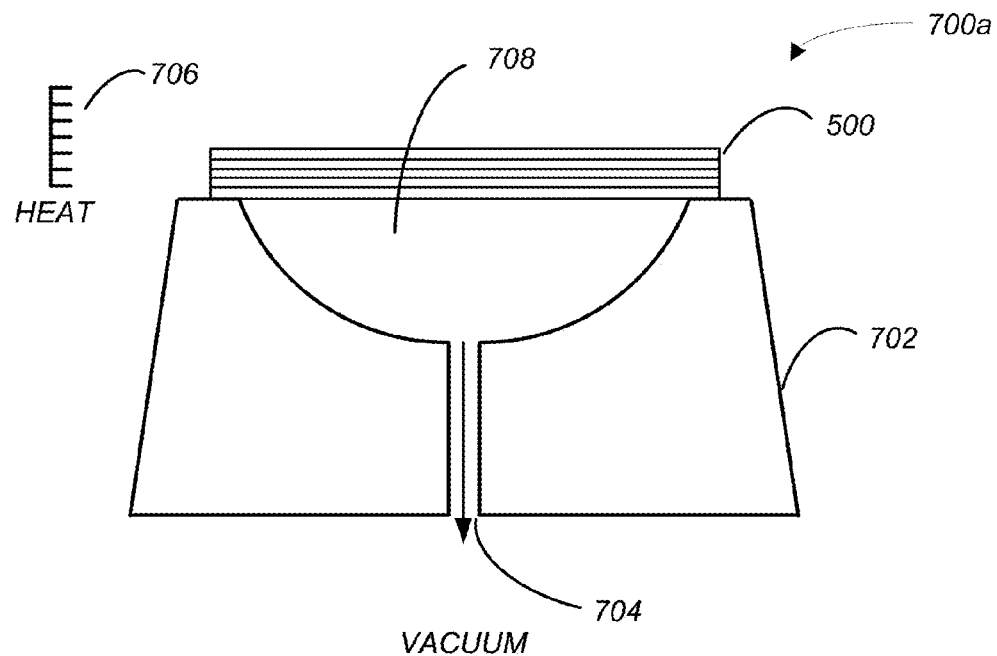
FIG. 7A and FIG. 7B are simplified diagrams illustrating a vacuum forming process according to some embodiments of the invention.
Figure 7B:
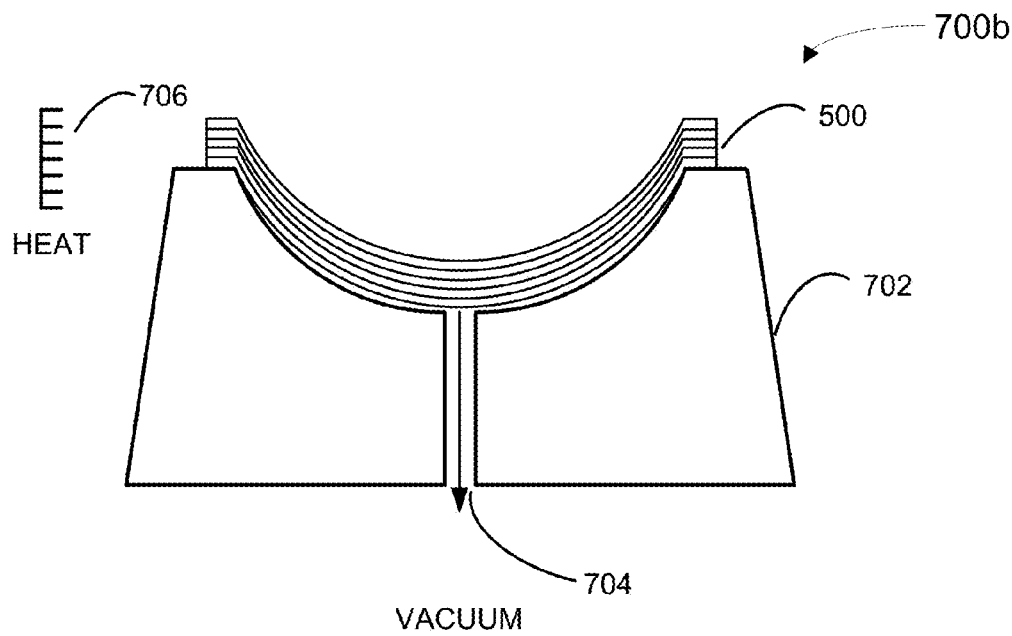

FIGS. 7A and 7B are simplified diagrams illustrating a vacuum forming process according to some embodiments of the invention. In FIGS. 7A-7B, the vacuum forming process is illustrated in two parts, 700a, 700b for simplicity of discussion. As shown in FIG. 7A, multi-layered coil assembly 500 from FIG. 5A is placed on a mold 702. Mold 702 can have a cavity characterized by a shape that corresponds to the final three-dimensional target shape of coil assembly 500. In FIG. 7A, this target shape has a concave bowl-like geometry. In other embodiments, the cavity shape of mold 702 can correspond to any other suitable geometry designed to conform to the contours of a charging surface of an electronic device or charging station.

In some embodiments, the cavity shape of mold 702 can be slightly different than the final target shape of coil assembly 500 to account for elastic deformation. In such embodiments, the cavity shape of mold 702 can be calculated to account for "spring-back" effects after molding. By taking such factors into account, the final three-dimensional shape of coil assembly 500 can precisely conform to a charging surface of the intended electronic device or charging station.

As shown FIG. 7A, pressure is applied to coil assembly 500 by means of a vacuum through outlet 704 in mold 702. In evacuating the air from a cavity region 708, the air pressure inside cavity region 708 becomes lower than the pressure outside cavity region 708 (i.e. on the upper surface pf coil assembly 500). This results in a suction force that "pulls" coil assembly 500 towards the cavity surface of mold 702. As the vacuum is applied, a heating element 706 can provide the appropriate temperature to soften coil assembly 500 thereby improving the ductility of the constituent layers. For example, heating can be provided through infra-red (IR) heating, radio frequency (RF) heating, hot air heating, and the like. In some embodiments, the heat and pressure can be maintained until insulating layer 306 (e.g., polyimide) has cured. In some embodiments, a temperature of 100-250° C. can be used. The length of time during which heat and pressure are applied can vary depending on, for example, the shape and size of coil assembly 500.

The vacuum forming process shown in FIGS. 7A-7B for forming the three-dimensional shape of coil assembly 500 can provide several advantages. For example, in the vacuum forming process, no force need be directly applied to the top surface of coil assembly 500. Such a configuration can minimize cracks or fractures otherwise caused by contact forces (i.e. from a plug member) during molding.

FIG. 7B shows coil assembly 500 in mold 702 after heat and pressure have been applied. As seen in FIG. 7B, coil assembly 500 can take the shape of mold 702. In some embodiments, coil assembly 500, in this shape, can conform to a charging surface of an electronic device or charging station and can represent the final shape of the coil assembly. In some other embodiments, the shape of coil assembly 500 may change upon removing the vacuum and/or cooling, owing to a spring-back effect. In such embodiments, the shape of the final coil assembly after spring-back may conform to the desired charging surface.

At the end of molding, and after cooling, the final multi-layered coil assembly having the three-dimensional shape may be rigid. According to some embodiments, a trimming or cutting of excess material can be performed prior to introducing the coil assembly of the desired shape and dimensions into an electronic device or charging station.

Although the layers of coil assembly 500 are depicted in FIGS. 6A-7B as being molded simultaneously, in some embodiments, one or more layers of coil assembly 500 can be formed and molded separately. Each layer can be molded using any suitable process described herein such as, for example, a compression molding and/or vacuum forming process. Separately molded layers having a three-dimensional shape may be assembled (e.g., using an adhesive) to form the final multi-layered coil assembly characterized by the three-dimensional shape.

Figure 8A:
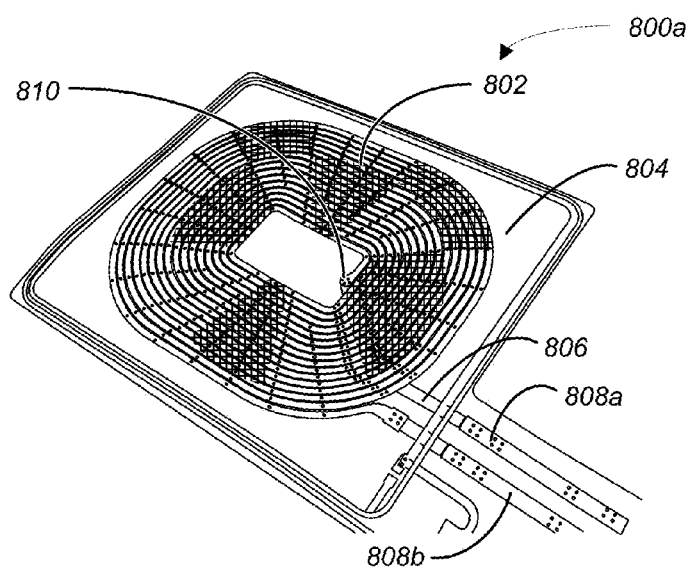
FIG. 8A and FIG. 8B are top and bottom views of a three-dimensional inductive coil assembly according to some embodiments of the invention.
Figure 8B:
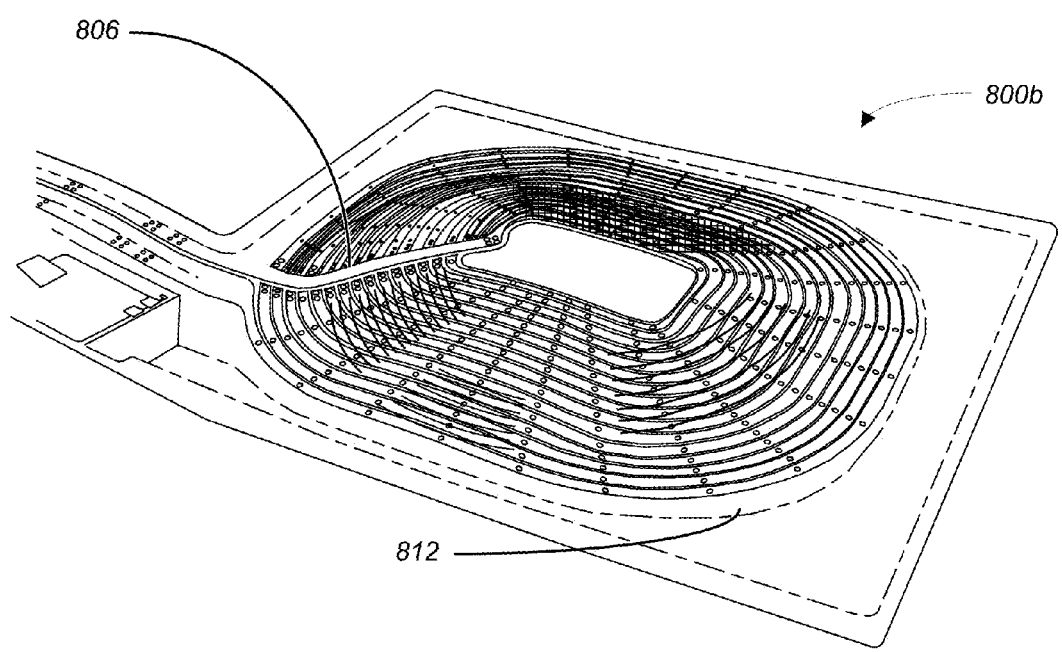

FIGS. 8A and 8B are top and bottom views 800a, 800b of a three-dimensional inductive coil assembly according to some embodiments of the invention. It should be noted that the terms "top view" and "bottom view" are used for simplicity of discussion, and that inductive coil assemblies in accordance with embodiments of the invention can be positioned within an electronic device or charging station in any suitable orientation. The coil assembly shown in FIGS. 8A-8B can be formed in accordance with the methods described herein (i.e. method 400) and using any suitable molding process such as compression molding (as shown in FIGS. 6A-6B), vacuum forming (as shown in FIGS. 7A-7B), or other suitable molding process. In other words, FIGS. 8A and 8B illustrate the result of forming and thermoforming multi-layered coil assembly 500 in some embodiments.

As seen in FIG. 8A, a patterned coil 802 is disposed on insulating layer 804 and has a three-dimensional helical shape. In some embodiments, patterned coil 802 may be coated or otherwise covered with a ferromagnetic (e.g., ferrite) layer (not shown in FIG. 8A). The coil assembly also includes a conductive trace element 806 on the opposite surface of insulating layer 804. Patterned coil 802 can include an end 810 that is electrically coupled to trace element 806 by, for example, a via that extends through insulating layer 804. Conductive trace element 806 can be electrically coupled to a wire 808a, and patterned coil 802 can be electrically coupled to a wire 808b.

If the coil assembly is a transmitter (e.g., in a charging station), time-varying electrical current can flow through wire 808a, trace element 806, patterned coil 802, and wire 808b, to generate a time-varying magnetic field. If the coil assembly is a receiver (e.g., in an electronic device), a time-varying magnetic field generated by a proximate transmitter coil can induce a current that flows through wire 808a, trace element 806, patterned coil 802, and wire 808b, the induced current being usable to charge a battery.

In the top view 800b of the coil assembly shown in FIG. 8B, the coil assembly further includes a laminate layer 812 under which conductive trace element 806 is disposed. As further shown in FIG. 8B, an outline of patterned coil 802 can also be seen through laminate layer 812 as a result of the molding process deforming insulating layer 804.

In some embodiments, instead of patterning and molding multi-layered structure 300 described above, a wound coil can be used as a starting structure and then molded into the desired three-dimensional shape by way of, for example, the thermoforming processed described above with regard to FIGS. 6A-7B. Use of wound coils in place of a multi-layered structure can provide advantages in a wireless power transfer system. For example, the dimensions of a wound coil and the amount of conductive material contained therein can be greater than that of a coil formed by the patterning techniques described herein. This can provide for lower impedance at target AC frequencies and increased inductance. The quality factor (Q) of the coil, which is a measure of efficiency, is thereby increased as it represents the ratio of inductive reactance to coil resistance at a selected frequency.

In some embodiments, an insulated metal (e.g., copper) wire can be mechanically wound into the desired spiral shape to form the coil. For example, the wire can be wound about an object having a circular cross section such a solid or hollow tube. The shape of the wound coil can be fixed by way of a suitable bonding material. In some embodiments, the insulator on the wire comprises an epoxy resin such as polyurethane or a polyester compound. A bonding agent such as polyimide, a rubber, nitrile or other heat-sensitive material can also be used. Upon heating the wound coil to a critical temperature determined by the selected organic materials, the wound insulated wire can be bonded into place to form a "resin-potted" wound coil. In some embodiments, the wound coil can have a planar geometry. The wound coil can then be molded into the desired three-dimensional shape using any suitable molding process including, for example, the thermoforming processes described above with respect to FIGS. 6A-7B.

Figure 9:
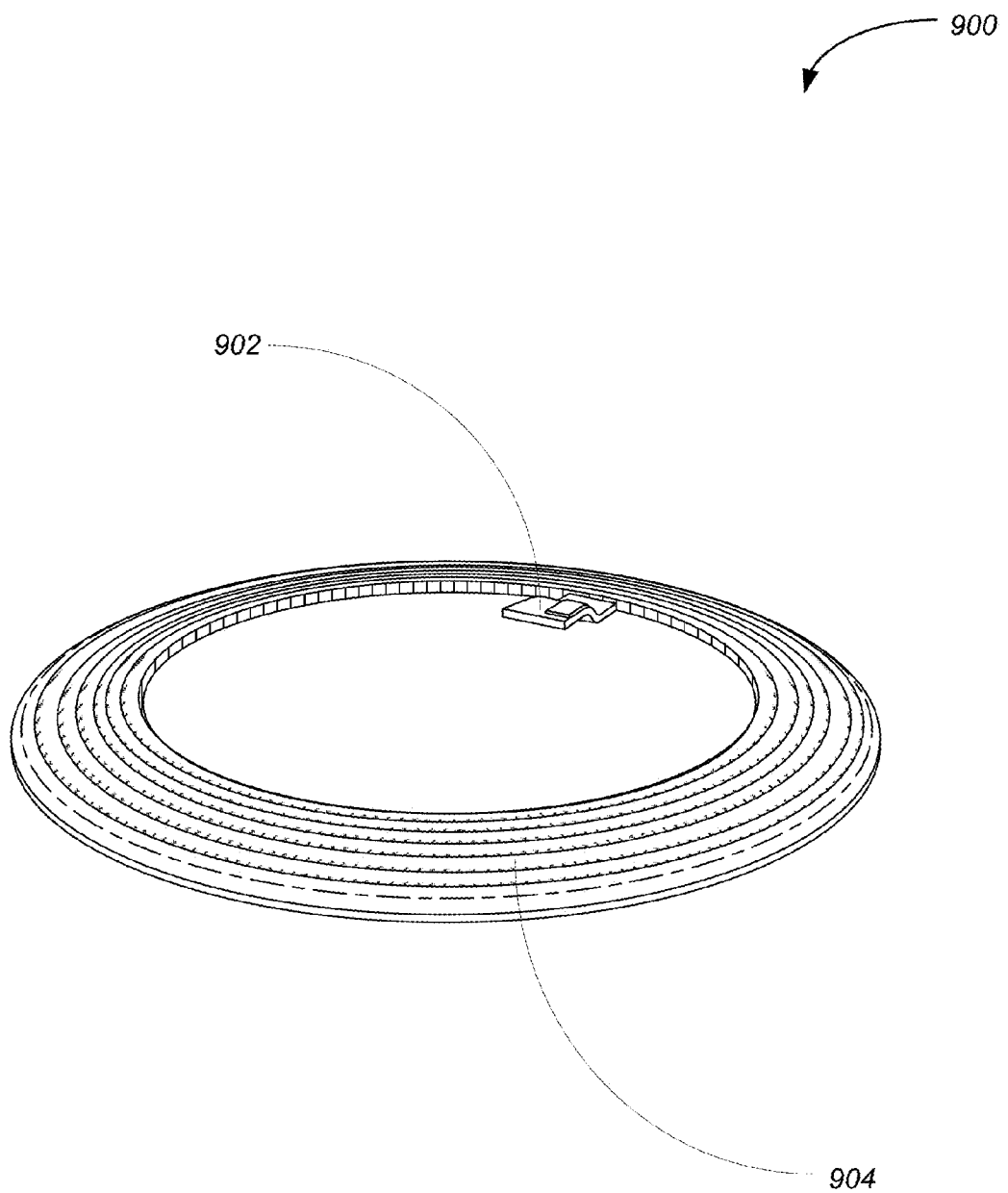
FIG. 9 shows a wound coil that has been formed into a three-dimensional inductive coil assembly according to some embodiments of the invention.

FIG. 9 shows a wound coil that has been formed into a three-dimensional inductive coil assembly 900 according to some embodiments of the invention. As shown in FIG. 9, assembly 900 comprises the wound coil 904 having a plurality of windings of insulated wire. The wire in wound coil 904 can comprise any suitable conductive metal such as copper, gold, silver, or the like. In some other embodiments, the wire can comprise another type of conductive material such as an alloy, semiconductor, conductive ceramic, conductive polymer, or the like.

As further shown in FIG. 9, wound coil 904 can be bonded in a resin. The resin can comprise polyurethane, polyester, or other suitable resin, and can further comprise a bonding agent such as a polyimide, rubber, nitrile, or the like. A conductive trace element 902 can be electrically coupled to the "beginning" and "end" of wound coil 904 to allow electrical current from a power source to flow through wound coil 904. Assembly 900, as shown in FIG. 9, has been molded into a three-dimensional shape using a thermoforming process such as compression molding (FIGS. 6A-6B), vacuum forming (FIGS. 7A-7B), or other suitable molding process.

Figure 10:
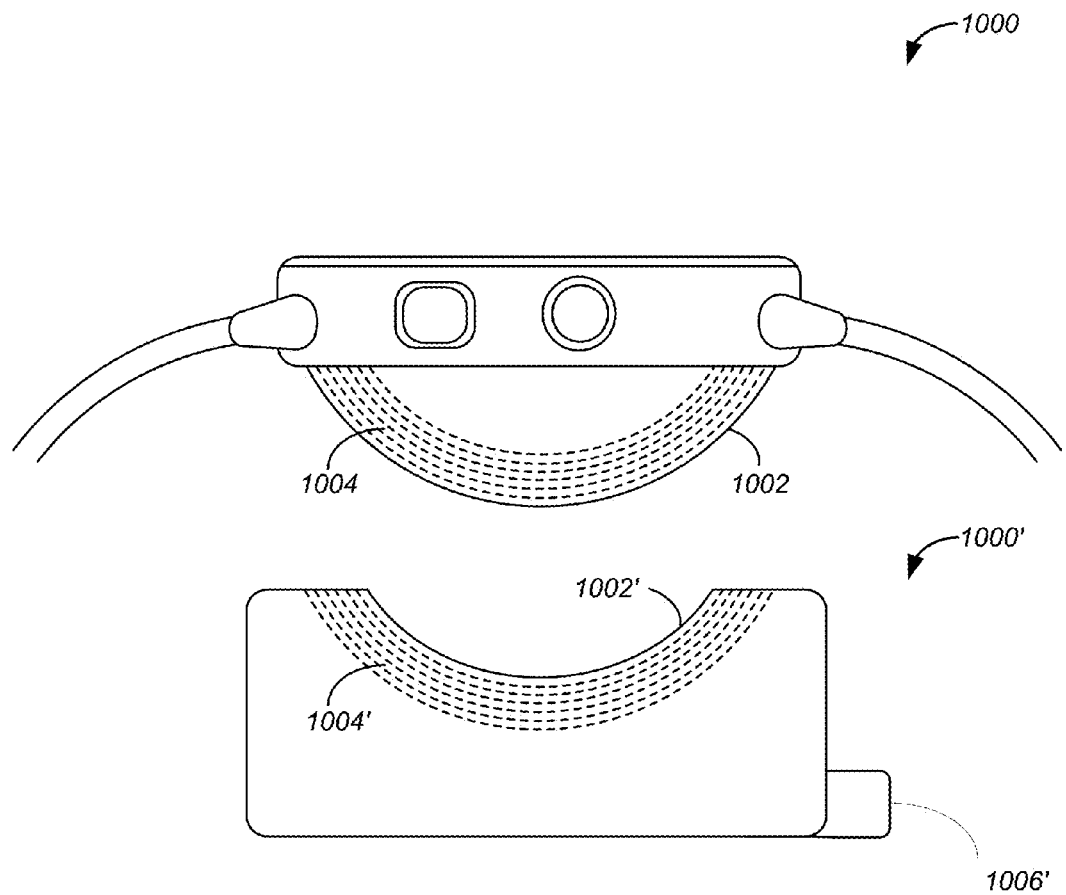
FIG. 10 is a simplified cross-sectional view of an example electronic device (i.e. a watch) and charging station including three-dimensional inductive coil assemblies according to some embodiments of the invention.

FIG. 10 is a simplified cross-sectional view of an example electronic device 1000 (i.e. a watch) and charging station 1000' including three-dimensional inductive coil assemblies according to some embodiments of the invention. Electronic device 1000 and charging station 1000' are examples of inductive charging components. As shown in FIG. 10, a receiver coil assembly 1004, formed according to embodiments of the invention, may be disposed adjacent to a non-planar (e.g., curved) charging surface 1002 of device 1000. In some embodiments, receiver coil assembly 1004 may be attached to surface 1002 by means of a pressure sensitive adhesive (PSA). The PSA can form a bond between the surface and the coil assembly when pressure is applied, without the need for a solvent, heat, or water to activate the PSA. Device 1000 can further include circuitry (not shown) configured to utilize current generated in receiver coil assembly 1004 to charge a battery.

Likewise, charging station 1000' can comprise a corresponding transmitter coil assembly 1004' formed according to embodiments of the invention. Transmitter coil assembly 1004' may be disposed adjacent to a non-planar (e.g., curved) charging surface 1002' of charging station 1000'. As seen in FIG. 10, charging surface 1002' may be contoured to conform to charging surface 1002 of device 1000 when device 1000 is docked in charging station 1000'. In some embodiments, transmitter coil assembly 1004' may also be attached to charging surface 1002' by means of a pressure sensitive adhesive (PSA). Charging station 1000' may be connected to a source of power through a power input 1006. The power source for the charging station 1000' can be a replaceable battery, rechargeable battery, external power supply, or the like. Charging station 1000' can further include circuitry (not shown) configured to generate time-varying current (e.g., AC) in transmitter coil assembly 1004' for wireless power transfer to device 1000.

In some embodiments, coil assemblies 1004 and 1004' can be identical. In some other embodiments, coil assemblies 1004 and 1004' can have different coil dimensions, numbers of windings, numbers of layers, etc. For example, transmitter coil assembly 1004' can have a greater number of turnings and/or thicker wire, and thus effectively more metal. Such a configuration can account for ohmic and other losses that may occur during wireless power transmission. In some embodiments where a wound coil such as coil 900 is used for the transmitter and receiver coil assemblies, the diameter of the transmitter coil can be greater than the diameter of the receiver coil.

During a charging operation, power may be transferred wirelessly from transmitter coil assembly 1004' to receiver coil assembly 1004. During such an operation, device 1000 can be docked in charging station 1000' with charging surfaces 1002 and 1002' adjacent to each other. In such a configuration, transmitter coil assembly 1004' may be aligned with receiver coil assembly 1004 along a shared axis in some embodiments.

The patterned coil of transmitter coil assembly 1004' can produce a time-varying electromagnetic flux to induce a current within the patterned coil of receiver coil assembly 1004. The patterned coil transmitter coil assembly 1004' may transmit power at a selected frequency or band of frequencies. In some embodiments, the transmit frequency is substantially fixed, although this is not required. For example, the transmit frequency may be adjusted to improve power transfer efficiency for particular operational conditions. More particularly, a high transmit frequency may be selected if more power is required by device 1000 and a low transmit frequency may be selected if less power is required. In some other embodiments, patterned coil of transmitter coil assembly 1004' may produce a static electromagnetic field and may physically move, shift, or otherwise change its position to produce a spatially-varying electromagnetic flux to induce a current within the patterned coil of receiver coil assembly 1004.

As shown in FIG. 10, the patterned coils of transmitter coil assembly 1004' and receiver coil assembly 1004 are disposed close together with very little or no gap between the coils and the surfaces. This arrangement can reduce leakage flux, thereby minimizing loss during transfer of power, improving charging efficiency, and allowing for faster charging.

Device 1000 may include a processor (not shown) that can be used to control the operation of or coordinate one or more functions of charging station 1000'. In some embodiments, charging station 1000' may include one or more sensors to determine whether device 1000 is present and ready to receive power from charging station 1000'. For example, charging station 1000' may include an optical sensor, such as an infrared proximity sensor. When charging station 1000' is attached to or brought within the proximity of device 1000, the infrared proximity sensor may produce a signal that the processor in device 1000 may use to determine the presence of charging station 1000'. Examples of other sensors that may be suitable to detect or verify the presence of device 1000 may include a mass sensor, a mechanical interlock, switch, button or the like, a Hall effect sensor, or other electronic sensor.

As previously mentioned, although embodiments described in the drawings and specification relate to coil assemblies as used in a personal wearable electronic devices such as a watch, embodiments of the invention can be used in a variety of wearable or non-wearable electronic devices in addition to the particular wrist-worn electronic devices discussed above. For example, embodiments of the invention may be used in Bluetooth headsets, smartphones, electronic glasses, wearable medical devices, and wearable fitness devices.

The foregoing description, for purposes of explanation, used specific nomenclature to provide a thorough understanding of the described embodiments. However, it will be apparent to one skilled in the art that the specific details are not required in order to practice the described embodiments. For example, while several specific embodiments of the invention described above use inductive coupling to wirelessly transmit power to a wearable electronic device, the invention is not limited to any particular wireless power transfer technique and other near-field or non-radiative wireless power transfer techniques as well as radiative wireless power transfer techniques can be used in some embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An inductive charging component for wireless charging comprising:
   a curved charging surface;
   an inductive coil assembly proximate the curved charging surface, the inductive coil assembly comprising:
   an insulating layer comprising a first surface and a second surface opposite the first surface;
   a conductive multi-turn coil arranged in a spiral pattern on the first surface of the insulating layer; and
   a conductive trace element affixed to the second surface of the insulating layer, wherein the conductive multi-turn coil and the conductive trace element are electrically coupled, the conductive multi-turn coil, the conductive trace element and the insulating layer having a curvature corresponding to the curved charging surface.

2. The inductive charging component of claim 1 wherein the conductive multi-turn coil, the insulating layer, and the conductive trace element have a non-planar geometry.

3. The inductive charging component of claim 1 wherein the conductive multi-turn coil and the conductive trace element are electrically coupled by a via formed through the insulating layer.

4. The inductive charging component of claim 2 further comprising a laminate layer disposed on the multi-turn coil, wherein the laminate layer has a non-planar geometry.

5. An inductive charging component comprising:
   a curved charging surface; and
   an inductive coil assembly adjacent to the curved charging surface, wherein the inductive coil assembly comprises:
   a polymer layer comprising a first surface and a second surface opposite the first surface, the polymer layer having a curvature corresponding to the curved charging surface;
   a multi-turn coil coupled to the first surface of the polymer layer and configured to transmit or receive power;
   a conductive trace element adhesive coupled to the second surface of the polymer layer; and
   a via formed through the polymer layer that electrically couples the multi-turn coil and the conductive trace element.

6. The inductive charging component of claim 5 wherein the polymer layer is non-planar, and wherein the inductive coil assembly is characterized by a three-dimensional shape such that it conforms to a contour of the curved charging surface.

7. The inductive charging component of claim 5 wherein the inductive coil assembly further comprises:
   a laminate layer disposed on the multi-turn coil.

8. The inductive charging component of claim 5 wherein the inductive coil assembly further comprises:
   a ferrite layer disposed on the conductive trace element.

9. The inductive charging component of claim 5, wherein the multi-turn coil is formed by patterning a metal layer affixed to the first surface of the polymer layer.

* * * * *